United States Patent
Becker et al.

(10) Patent No.: US 10,459,038 B2
(45) Date of Patent: Oct. 29, 2019

(54) METHOD AND DEVICE FOR ESTIMATING A CURRENT OPEN-CIRCUIT VOLTAGE CHARACTERISTIC OF A BATTERY

(71) Applicant: Robert Bosch GmbH, Stuttgart (DE)

(72) Inventors: Jens Becker, Ludwigshafen am Rhein (DE); Michael Erden, Bebra (DE); Olivier Cois, Kernen (DE); Triantafyllos Zafiridis, Heilbronn (DE)

(73) Assignee: Robert Bosch GmbH, Stuttgart (DE)

( * ) Notice: Subject to any disclaimer, the term of this patent is extended or adjusted under 35 U.S.C. 154(b) by 139 days.

(21) Appl. No.: 15/214,627

(22) Filed: Jul. 20, 2016

(65) Prior Publication Data
US 2017/0030974 A1    Feb. 2, 2017

(30) Foreign Application Priority Data

Jul. 27, 2015    (DE) .......................... 10 2015 214 128

(51) Int. Cl.
*G01R 31/388* (2019.01)
*G06F 17/00* (2019.01)
(Continued)

(52) U.S. Cl.
CPC ..... *G01R 31/388* (2019.01); *G01R 19/16542* (2013.01); *G01R 31/367* (2019.01);
(Continued)

(58) Field of Classification Search
CPC ............ G01R 31/3637; G01R 31/3651; G01R 31/3679; G01R 19/16542; G01R 31/388;
(Continued)

(56) References Cited

U.S. PATENT DOCUMENTS 6,377,030 B1 *  4/2002  Asao ................... H01M 10/052
                                                     320/161
2010/0156351 A1 *  6/2010  Ugaji ................. G01R 31/3679
                                                     320/132
(Continued)

FOREIGN PATENT DOCUMENTS

DE    102010051008 A1    5/2012
DE    102012205144 A1    10/2013
(Continued)

OTHER PUBLICATIONS

Liu Guangming et al: "Online estimation of lithium-ion battery remaining discharge capacity through diffrenetial voltage analysis", Journal of Power Sources, Elsevier SA, CH, vol. 274, Oct. 28, 2014 (Oct. 28, 2014), pp. 971-989.

*Primary Examiner* — Gregory J Toatley, Jr.
*Assistant Examiner* — Lynda Dinh
(74) *Attorney, Agent, or Firm* — Michael Best & Friedrich LLP

(57) ABSTRACT

A method for estimating a current open-circuit voltage characteristic of a battery, comprising acquiring a portion of an actual open-circuit voltage characteristic of the battery, detecting or defining a significant point in the acquired portion of the actual open-circuit voltage characteristic, identifying a point, in a characteristic curve of an anode potential of the battery and/or in a characteristic curve of a cathode potential of the battery, that is associated with the significant point, shifting and/or scaling the characteristic curve of the anode potential and the characteristic curve of the cathode potential on the basis of the position of the significant point with respect of the associated point, until the acquired portion is simulated by combination of the shifted and/or scaled characteristic curves, and calculating
(Continued)

the current open-circuit voltage characteristic on the basis of the shifted and/or scaled characteristic curves.

7 Claims, 4 Drawing Sheets

(51) Int. Cl.
| | |
|---|---|
| H01M 10/48 | (2006.01) |
| G01R 31/367 | (2019.01) |
| G01R 31/392 | (2019.01) |
| G06F 17/18 | (2006.01) |
| H01M 10/42 | (2006.01) |
| G01R 19/165 | (2006.01) |

(52) U.S. Cl.
CPC ........... *G01R 31/392* (2019.01); *G06F 17/18* (2013.01); *H01M 10/4285* (2013.01); *H01M 10/48* (2013.01)

(58) Field of Classification Search
CPC ............... G01R 31/396; G01R 31/382; G01R 31/3842; G01R 21/06; G06F 17/18; H01M 10/4285; H01M 10/48

USPC .......................................................... 702/63
See application file for complete search history.

(56) References Cited

U.S. PATENT DOCUMENTS

| | | | |
|---|---|---|---|
| 2010/0156356 A1* | 6/2010 | Asakura | H01M 10/44 320/148 |
| 2010/0174499 A1* | 7/2010 | Kang | G01R 31/3651 702/63 |
| 2014/0214347 A1 | 7/2014 | Laskowsky et al. | |
| 2014/0361752 A1* | 12/2014 | Brecht | H02J 7/0052 320/149 |
| 2015/0066407 A1* | 3/2015 | Joe | G01R 31/3606 702/63 |

FOREIGN PATENT DOCUMENTS

| | | |
|---|---|---|
| EP | 2557428 A1 | 2/2013 |
| EP | 2808690 A1 | 12/2014 |
| EP | 2846395 A2 | 3/2015 |
| JP | 2012137330 | 7/2012 |
| NO | 2009078905 A1 | 6/2009 |

* cited by examiner

METHOD AND DEVICE FOR ESTIMATING A CURRENT OPEN-CIRCUIT VOLTAGE CHARACTERISTIC OF A BATTERY

REFERENCE TO PRIOR APPLICATION

The present application claims priority to German patent application no. 10 2015 214 128.4 filed on Jul. 27, 2015.

BACKGROUND OF THE INVENTION

The present invention relates to a method and a device for estimating a current open-circuit voltage characteristic of a battery.

Present-day battery systems are able to determine a current capacity and a current state of health of an associated battery, and to make these available. For this purpose, it is necessary to acquire a time characteristic of a battery voltage and of a battery current of the battery.

A change in the charge level of the battery can be determined from the time characteristic of the battery voltage and an open-circuit voltage characteristic of the battery. A delivered or received charge of the battery, referred to later as a change in charge, can be determined from the time characteristic of the battery current.

A current capacity of the battery can be inferred from the change in charge and from the change in the charge level. The state of health of the battery can be inferred from the current capacity of the battery and an original capacity of the battery.

In this case there arises that problem that, in order for the capacity and the state of health of the battery to be calculated accurately, the change in charge and the associated change in the charge level must be very large in order to obtain precise information. Consequently, for a precise calculation of this information, an almost complete charging and discharging cycle is required.

In addition, there arises the problem that the open-circuit voltage characteristic of the battery is not constant over the service life of the latter, and imprecise capacity calculations may result from an open-circuit voltage characteristic, on which the calculation is based, that is no longer current.

JP2012-137330, the contents of which are incorporated by reference, discloses a method in which an open-circuit voltage characteristic of a battery is determined on the basis of a characteristic curve of an anode potential and of a characteristic curve of the cathode potential.

SUMMARY OF THE INVENTION

The method according to the invention for estimating a current open-circuit voltage characteristic of a battery comprises acquiring a portion of an actual open-circuit voltage characteristic of the battery, detecting or defining a significant point in the acquired portion of the actual open-circuit voltage characteristic, identifying a point, in a characteristic curve of an anode potential of the battery and/or in a characteristic curve of a cathode potential of the battery, that is associated with the significant point, shifting and/or scaling the characteristic curve of the anode potential and the characteristic curve of the cathode potential on the basis of the position of the significant point with respect of the associated point, until the acquired portion is simulated by combination of the shifted and/or scaled characteristic curves, and calculating the current open-circuit voltage characteristic on the basis of the shifted and/or scaled characteristic curves.

It is thereby made possible to estimate a current open-circuit voltage characteristic of the battery without an almost complete charging or discharging of the battery having been effected beforehand. In addition, it is made possible to briefly update the open-circuit voltage characteristic and thus to adapt to a change during the service life of the battery. In the detecting of a particular point, a point is identified on the basis of predefined properties. In the detecting of a particular point, any point or a particular point is selected as a significant point.

The device according to the invention is designed to execute the method according to the invention, and has all advantages of the method according to the invention.

The dependent claims show preferred developments of the invention.

It is advantageous if the portion of the actual open-circuit voltage characteristic is acquired by acquiring a multiplicity of measurement points. In this way, the first open-circuit voltage characteristic can be reserved, using minimal storage capacity, until it is used further.

It is also advantageous if the detecting of the significant point includes interpolating the acquired multiplicity of measurement points. In this way, a position of the significant point can be determined in a particularly precise manner.

It is additionally advantageous if the significant point is a maximum or a minimum in a slope or curvature of the actual open-circuit voltage characteristic, or is a point of inflection of the actual open-circuit voltage characteristic. Such a point is particularly characteristic, and therefore particularly reliable in the characteristic curve of the anode potential and in the characteristic curve of the cathode potential. Moreover, such a significant point is mathematically particularly easy to identify, thereby reducing the amount of computing work required.

Moreover, it is advantageous if the method additionally includes determining a battery capacity on the basis of the current open-circuit voltage characteristic. Accuracy of estimation in respect of the battery capacity is thereby increased significantly.

It is also advantageous if the shifting and/or scaling of one of the two characteristic curves is effected first, and the other of the two characteristic curves is subsequently scaled and/or shifted to a corresponding extent. In this way, the amount of computing work required for the method is minimized.

BRIEF DESCRIPTION OF THE DRAWINGS

Exemplary embodiments of the invention are described in detail in the following with reference to the accompanying drawing. There are shown in the drawing.

DETAILED DESCRIPTION

The present invention is based on the principle that each open-circuit voltage characteristic of a battery can be calculated using an associated characteristic curve of the anode potential of the battery and an associated characteristic curve of the cathode potential of the battery. This applies to each state of ageing of the battery, i.e. from the beginning of life (BOL) to the end of life (EOL) of the battery.

A characteristic curve of the anode potential or of the cathode potential of the battery is also referred to as an OCP. An open-circuit voltage characteristic of the battery is also referred to as an OCV.

Figure 1:
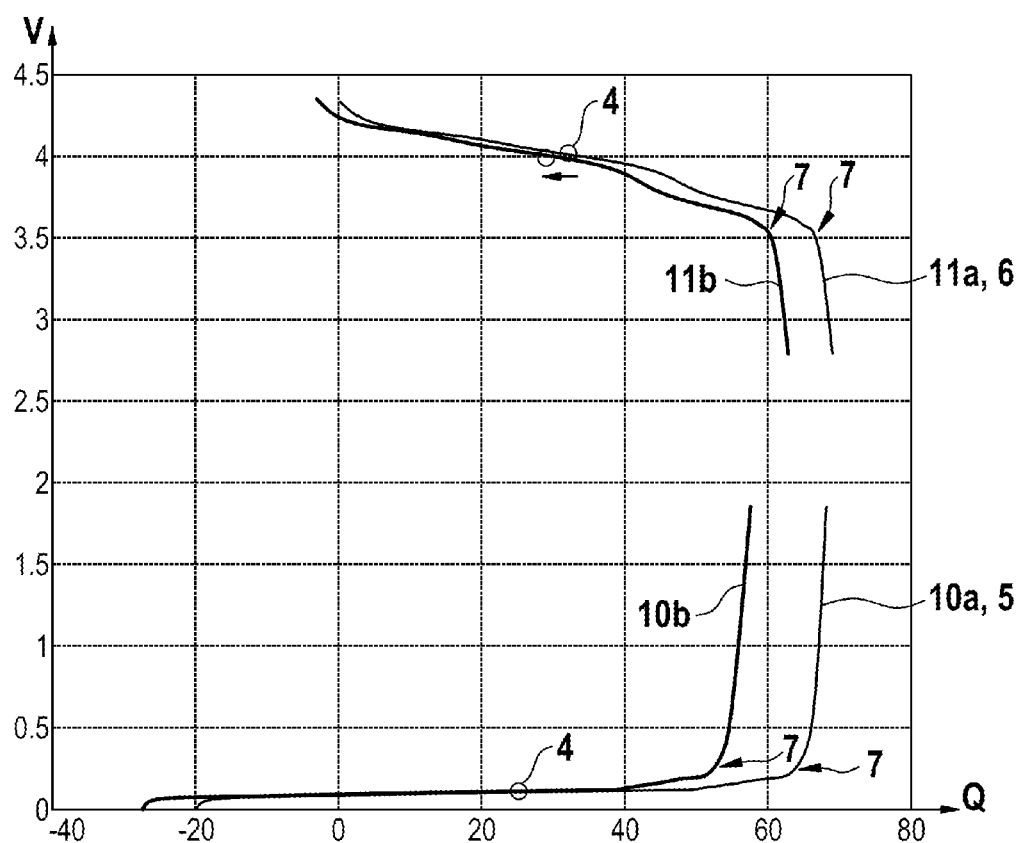
FIG. 1 a diagram showing two exemplary characteristic curves of an anode potential and two exemplary characteristic curves of a cathode potential, FIG. 2 a diagram showing two exemplary open-circuit voltage characteristics, FIG. 3 a sequence diagram of the method according to the invention, in a first embodiment, and FIG. 4 a diagram showing shifting and scaling of a characteristic curve of the anode potential and of a characteristic curve of the cathode potential, according to an embodiment of the invention.

FIG. 1 shows a diagram in which a first characteristic curve of an anode potential 10a, a second characteristic curve of an anode potential 10b, a first characteristic curve of a cathode potential 11a and a second characteristic curve of a cathode potential 11b are represented. In this case, the first characteristic curve of the anode potential 10a and the first characteristic curve of the cathode potential 11a describe a battery in a first state of ageing. The second characteristic curve of the anode potential 10b and the second characteristic curve of the cathode potential 11b describe the battery in a second state of ageing.

Figure 2:
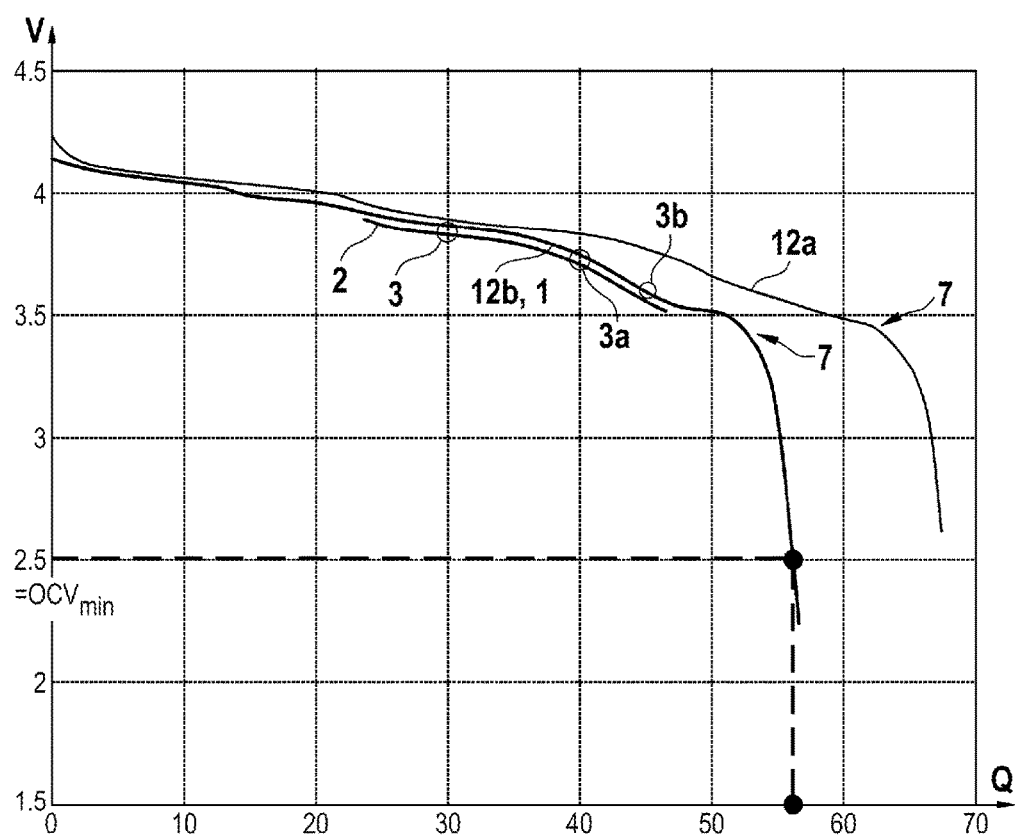

FIG. 2 shows a diagram in which a first open-circuit voltage characteristic 12a and a second open-circuit voltage characteristic 12b are represented. The first open-circuit voltage characteristic 12a is an open-circuit voltage characteristic of the battery in the first state of ageing. The second open-circuit voltage characteristic 12b is an open-circuit voltage characteristic of the battery in the second state of ageing.

The first open-circuit voltage characteristic 12a can be determined from the first characteristic curve of the anode potential 10a and the first characteristic curve of the cathode potential 11a.

Mathematically, the first characteristic curve of the anode potential 10a is a function over a charge level Q of the battery. In the diagram represented in FIG. 2, the charge level Q is indicated on the x-axis. The charge level in this case is described by a value that describes a charge quantity, for example in ampere hours, delivered by the battery starting from a maximum charge. Therefore, the first characteristic curve of the anode potential 10a is described by a function $f_{an}(Q)$. The same applies to the first characteristic curve of the cathode potential 11a, which is therefore described by a function $f_{cat}(Q)$.

In order to determine the first open-circuit voltage characteristic 12a from the first characteristic curve of the anode potential 10a and the first characteristic curve of the cathode potential 11a, the anode potential is subtracted from the cathode potential. The following thus applies:

$$OCV_1(Q) = f_{cat}(Q) - f_{an}(Q)$$

In this case, $OCV_1(Q)$ represents a function that describes the first open-circuit voltage characteristic 12a.

With regard to FIG. 1, it can be seen that the first characteristic curve of the anode potential 10a and the second characteristic curve of the anode potential 10b are similar in their characteristic, and that the first characteristic curve of the anode potential 10a can be transformed into the second characteristic curve of the anode potential 10b by scaling and shifting. Thus, the second characteristic curve of the anode potential 10b can be described by a function $f_{an}(\alpha_{an}Q + \beta_{an})$, which corresponds to a shifted and scaled function $f_{an}(Q)$. The factor $\alpha_{an}$ in this case is a factor for the scaling, and the factor $\beta_{an}$ is a factor for the shifting of the second characteristic curve of the anode potential 10b in respect of the first characteristic curve of the anode potential 10a.

In a corresponding manner, the first characteristic curve of the cathode potential 11a can be transformed into the second characteristic curve of the cathode potential 11b by scaling and shifting. Thus, the second characteristic curve of the cathode potential 11b can be described by a function $f_{cat}(\alpha_{cat}Q + \beta_{cat})$, which corresponds to a shifted and scaled function $f_{cat}(Q)$. The factor $\alpha_{cat}$ in this case is a factor for the scaling, and the factor $\beta_{cat}$ is a factor for the shifting of the second characteristic curve of the cathode potential 11b in respect of the first characteristic curve of the cathode potential 11a.

Since the second open-circuit voltage characteristic 12b can be determined from the second characteristic curve of the anode potential 10b and the second characteristic curve of the cathode potential 11b, the following therefore applies:

$$OCV_2(Q) = f_{cat}(\alpha_{cat}Q + \beta_{cat}) - f_{an}(\alpha_{an}Q + \beta_{an})$$

In this case, $OCV_2(Q)$ represents a function that describes the second open-circuit voltage characteristic 12b.

According to the invention, a current open-circuit voltage characteristic of a battery that occurs, for example, after a certain ageing of the battery, is determined on the basis of the principles described above, by means of scaling and shifting of a characteristic curve of the anode potential of the battery and of a characteristic curve of the cathode potential of the battery.

Figure 3:
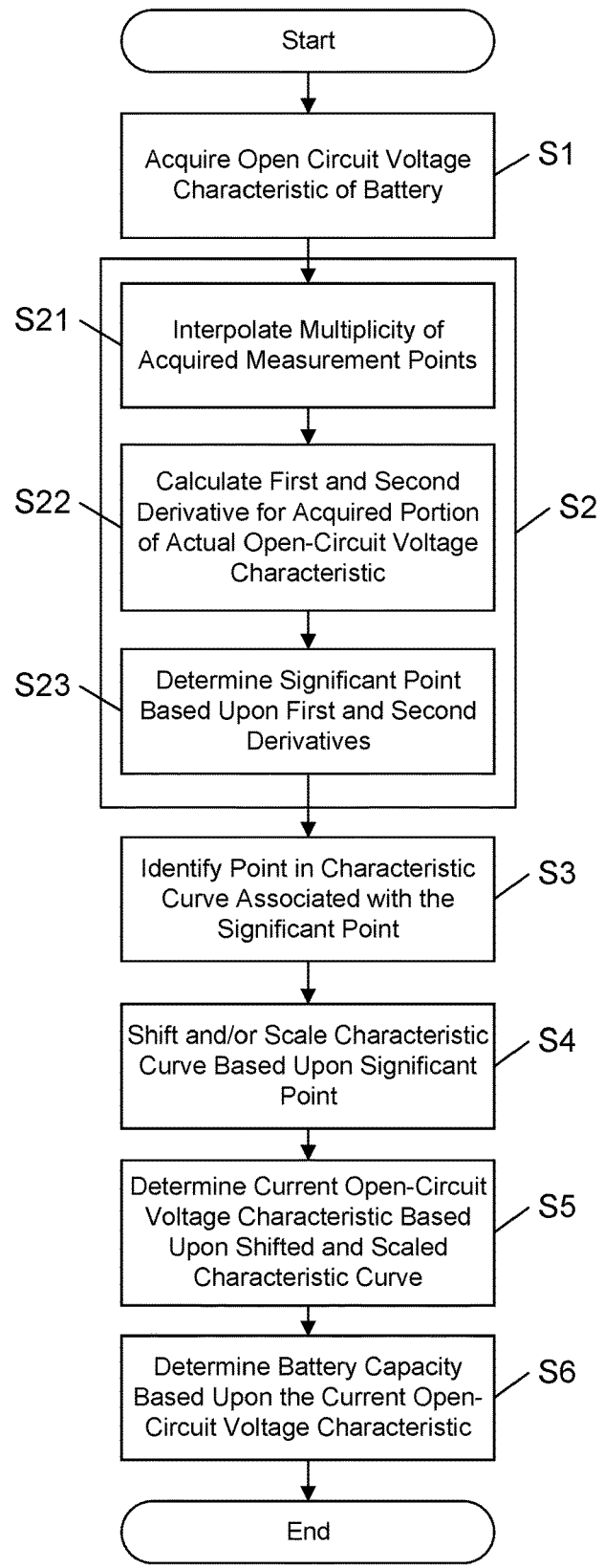

FIG. 3 shows a sequence diagram of a method according to the invention, in a first embodiment. When the method is started, a first step S1 is performed first.

In the first step S1, a portion 2 of an actual open-circuit voltage characteristic 1 of the battery is acquired. The actual open-circuit voltage characteristic 1 is an open-circuit voltage characteristic that the battery actually has at the instant at which the method according to the invention is executed. A voltage of the battery and an electric current delivered or consumed by the battery are measured. A change in the charge level of the battery is calculated from these values, and an associated voltage value is stored, respectively, for a plurality of charge levels within this change in the charge level. Each voltage value represents a measurement point. Thus, the portion 2 of the actual open-circuit voltage characteristic 1 is acquired by acquisition of a multiplicity of measurement points.

The portion 2 acquired in the acquisition of the portion 2 of the actual open-circuit voltage characteristic 1 corresponds approximately to an associated portion of the current open-circuit voltage characteristic of the battery. Since only a portion of the actual open-circuit voltage characteristic was acquired, however, a complete open-circuit voltage characteristic is determined in a further step, in order to estimate the current open-circuit voltage characteristic of the battery.

After the first step S1, a second step S2 is executed. In this step, a significant point 3 in the acquired portion 2 of the actual open-circuit voltage characteristic is detected. The second step S2 is sub-divided into a first sub-step S21, a second sub-step S22 and a third sub-step S23.

Firstly, the first sub-step S21 is executed. In the first sub-step S21, interpolation of the acquired multiplicity of measurement points is performed. In this sub-step, the voltage values lying between the acquired measurement points are interpolated so that the portion 2 of the actual open-circuit voltage characteristic of the battery is obtained in the form of a continuous curve.

In the subsequent, second, sub-step S22, a first derivative and a second derivative are calculated for the acquired portion 2 of the actual open-circuit voltage characteristic.

In the subsequent, third, sub-step S23, the significant point 3 is determined on the basis of the derivatives of the actual open-circuit voltage characteristic calculated for the portion 2, and thus detected.

An acquired portion 2 of the actual open-circuit voltage characteristic of the battery is shown exemplarily in FIG. 2. It is to be assumed in this case that the second open-circuit voltage characteristic 12b corresponds to an actual open-circuit voltage characteristic of the battery. A portion 2 of this actual open-circuit voltage characteristic was acquired in the first step S1. The derivatives determined in the second step S2 are used to determine the significant point 3, which, in the example shown in FIG. 2, is distinguished in that a point of inflection occurs in the actual open-circuit voltage characteristic 2. This point of inflection occurs approximately at a charge level Q of the battery that is described by the value "30". Such a point of inflection may be identified, for example, by a zero of the second derivative.

Instead of a point of inflection selected here, exemplarily, as a significant point 3, local maxima or local minima in a slope or curvature of the second open-circuit voltage characteristic 12b, in the acquired portion 2, are suitable, in particular, for selection as a significant point 3. According to the invention, a significant point 3 may also be defined by the properties of a plurality of mutually adjacent points, i.e. a curve characteristic.

Shown as an alternative significant point in FIG. 2 is a maximum 3a in a curvature of the second open-circuit voltage characteristic 12b, which may be determined, for example, from a maximum of the first derivative of the acquired portion 2 of the actual open-circuit voltage characteristic. Shown as a further alternative significant in FIG. 2 is a local maximum 3b in a slope of the second open-circuit voltage characteristic 12b, which may be determined, for example, from a maximum of the first derivative of the acquired portion 2 of the second open-circuit voltage characteristic 12b. Differing significant points may also be selected, in order to identify an associated point in the characteristic curve of the anode potential and in the characteristic curve of the cathode potential, on the basis of differing significant points. Definition or identification of a plurality of significant points is also advantageous.

In alternative embodiments of the invention, a given point of the acquired portion 2 of the second open-circuit voltage characteristic 1 is defined as a significant point 3. The associated point 4 in this case may be identified, for example, by means of a curve characteristic in the region of the significant point 3 and in the region of the associated point.

Following the second step S2, a third step S3 is executed. In this step, a point 4 associated with the significant point 3 is identified in a characteristic curve of an anode potential 5 of the battery and in a characteristic curve of a cathode potential 6 of the battery. In this embodiment, the characteristic curve of the anode potential 5 and the characteristic curve of the cathode potential 6 are characteristic curves that were measured and stored once at the time of manufacture of the battery. It is to be assumed that the characteristic curve of the anode potential 5 corresponds to the first characteristic curve of the anode potential 10a shown in FIG. 1, and the characteristic curve of the cathode potential 6 corresponds to the first characteristic curve of the cathode potential 11a shown in FIG. 1.

As described above, in this first embodiment the significant point 3 is a point of inflection in the actual open-circuit voltage characteristic. Therefore, in this first embodiment, in the third step S3 a point of inflection is likewise sought and identified in the characteristic curve of the anode potential 5 and in the characteristic curve of the cathode potential 6. In this case, a search may be limited to a predefined region of the characteristic curve of the anode potential 5 and of the characteristic curve of the cathode potential 6, in order to enable discrimination in the case of a plurality of points of inflection in these characteristic curves. It can be seen from FIG. 1 that these characteristic curves have an associated point of inflection. The associated point 4 in the characteristic curves of the anode potential and of the cathode potential is thus the associated point of inflection that likewise occurs in these characteristic curves 5, 6.

Since the points of inflection are not easily identifiable in FIGS. 1 and 2, owing to the flat curve characteristic, it is pointed out that the acquired portion 2 of the actual open-circuit voltage characteristic could also extend over the kink 7 that occurs in all characteristic curves. It is then clearly evident that this kink 7 occurs in all described characteristic curves, and can be recognized.

Following execution of the third step S3, a fourth step S4 is executed. In the fourth step S4, the characteristic curve of the anode potential 5 and/or the characteristic curve of the cathode potential 6 are/is shifted and/or scaled, on the basis of the position of the significant point 3 in respect of the associated point 4, until the acquired portion 2 is simulated to the best possible extent by combination of the shifted characteristic curves 5, 6.

For this purpose, in this embodiment, the characteristic curve of the anode potential 5 and the characteristic curve of the cathode potential 6 are first shifted and scaled in such a manner that the associated point 4 of the characteristic curve of the anode potential 5 and the associated point 4 of the characteristic curve of the cathode potential 6 are shifted such that these points fall on the charge level that is associated with the significant point 3. The thus shifted and scaled characteristic curves are then used to determine an associated temporary open-circuit voltage characteristic for the portion 2. A squared deviation between the portion 2 of the actual open-circuit voltage characteristic and an associated portion of the temporary open-circuit voltage characteristic is determined. The thus determined deviation is minimized by adjustment of the shifting and scaling of the characteristic curve of the anode potential 5 and of the characteristic curve of the cathode potential 6. Since the shifting and scaling of the characteristic curve of the anode potential 5 and of the characteristic curve of the cathode potential 6 are dependent on associated shifting factors and scaling factors that were formed beforehand, for example by the factors $\alpha_{an}$, $\alpha_{cat}$, $\beta_{an}$ and $\beta_{an}$, a value is thus determined for each of these factors in this fourth step.

Following execution of the fourth step S4, a fifth step S5 is executed. In this step, the current open-circuit voltage characteristic is calculated on the basis of the shifted and/or scaled characteristic curves. This is effected on the basis of the relationship, on which the invention is based, that has already been described with regard to the second open-circuit voltage characteristic $OCV_2(Q)$. In a corresponding manner, the following is obtained for the current open-circuit voltage characteristic, which is described by the function $OCV_{act}(Q)$:

$$OCV_{act}(Q) = f_{cat}(\alpha_{cat}Q + \beta_{cat}) - f_{an}(\alpha_{an}Q + \beta_{an})$$

The underlying functions $f_{cat}(Q)$ and $f_{an}(Q)$ describe the characteristic curve of the anode potential 5 stored at the time of the production of the battery and the characteristic curve of the cathode potential 6 stored at the time of production of the battery. The thus calculated current open-circuit voltage characteristic is an estimated current open-circuit voltage characteristic.

Following execution of the fifth step S5, a sixth step S6 is executed. In this step, a battery capacity is determined on the basis of the current open-circuit voltage characteristic. For this purpose, an associated charge level Q of the battery is determined, in the determined current open-circuit voltage characteristic, that is associated with a predefined minimum battery voltage. This associated charge level Q of the battery describes the battery capacity of the battery.

Figure 4:
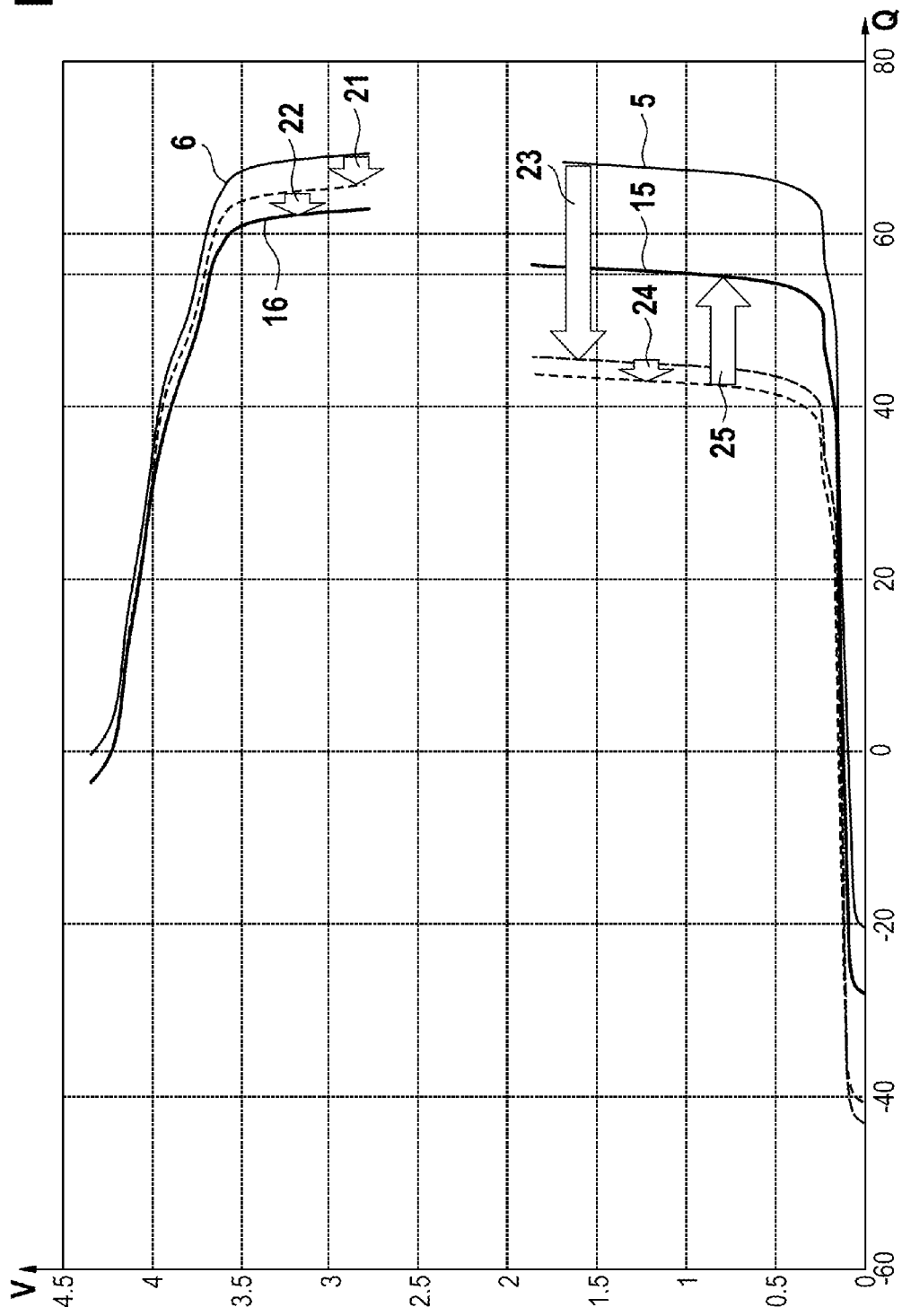

FIG. 4 shows an exemplary shifting and scaling of the characteristic curves of the anode potential and of the cathode potential in a preferred embodiment of the invention.

Firstly, the characteristic curve of the cathode potential 6 is scaled, as represented by a first arrow 21. The characteristic curve of the cathode potential 6 is then shifted, as represented by a second arrow 22. In this case, the characteristic curve of the cathode potential 6 is shifted in such a manner that the potential of an anode of the battery described by this characteristic curve, in the case of full charging of the battery, is maintained. The factor $\alpha_{cat}$ is therefore determined, at least provisionally, by the scaling of the characteristic curve of the cathode potential 6. The factor $\beta_{cat}$ is therefore determined, at least provisionally, by the shifting of the characteristic curve of the cathode potential 6.

The following thus applies in respect of the characteristic curve of the cathode potential 6, which is also referred to in the following as $OCP_{cat}$:

$$OCP_{cat} = f_{cat}(Q \cdot \gamma - \delta)$$

In this case, $\gamma$ stands for the determined value of the factor $\alpha_{cat}$, and therefore for the scaling represented by the first arrow 21. Moreover, $\delta$ stands for the determined value of the factor $\beta_{cat}$, and therefore for the shift represented by the second arrow 22.

In the following, the characteristic curve of the anode potential 5 is scaled and shifted. The characteristic curve of the anode potential 5 is also referred to as $OCP_{an}$ in the following. The shifting and scaling of the anode potential 5 is effected on the basis of the following equation:

$$OCP_{an} = f_{an}([Q - pBOL] \cdot \gamma + pACT)$$

In this case, the value pBOL is the charge level at which the significant point 3 occurs in the open-circuit voltage characteristic of the battery, when the battery is still at the start of its life cycle (beginning of life). The value pACT is the charge level at which the significant point 3 occurs in the actual open-circuit voltage characteristic of the battery. In FIG. 4 a weighted sift, resulting from the term [Q−pBOL], is represented by a third arrow 23. A scaling by the factor $\alpha$ is represented by a fourth arrow 24. A shift by the value pACT is represented by a fifth arrow 25.

It can be seen that, in the case of the example described on the basis of FIG. 4, a shift of the characteristic curves is predefined in a fixed manner. Only one single scaling factor $\alpha$, on which both the characteristic curve of the anode potential 5 and the characteristic curve of the cathode potential 6 depend, is varied, in order to minimize the variation between the portion 2 of the actual open-circuit voltage characteristic 2 and the associated portion of the temporary open-circuit voltage characteristic.

In further alternative embodiments, a current capacity of the battery is determined from the charge levels of the anode $Q^+$ and of the cathode $Q^-$. The method corresponds to the first embodiment, but with the characteristic curve of the anode potential and the characteristic curve of the cathode potential being considered independently. This means that the cathode and the anode may differ in their charge level.

As already described, the open-circuit voltage of a battery, in particular of a battery cell, can be determined from the characteristic curves of the anode potential and of the cathode potential.

The following thus applies:

$$OCV_{cell} = OCP^+(SOC^+) - OCP^-(SOC^-)$$

In this case, $OCV_{cell}$ is the open-circuit voltage of the battery. $OCP^+(SOC^+)$ is the characteristic curve of the cathode potential dependent on a cathode-side state of charge $SOC^+$ of the battery (SOC=state of charge). $OCP^-(SOC^-)$ is the characteristic curve of the anode potential dependent on an anode-side state of charge $SOC^-$ of the battery. The state of charge of the battery is a ratio between the charge level Q of the battery and the capacity C of the battery. The following thus applies:

$$OCV_{cell} = OCP^+(Q^+/C^+) - OCP^-(Q^-/C^-)$$

The cathode-side capacity $C^+$ of the battery results from a cathode-side capacity of the battery, at the beginning of its life, and a state of health of the cathode. The anode-side capacity $C^-$ of the battery results from the anode-side capacity of the battery, at the beginning of its life, and a state of health of the anode.

In this case, a ratio between an ageing of the anode and an ageing of the cathode may also be taken into account. Separate consideration of the cathode-side and anode-side capacity $C^+$ and $C^-$ enables an ageing of the battery to be simulated in a particularly accurate manner.

The maximum capacity of the battery at a certain state of ageing can be determined from the charge levels of the anode $Q^+$ and of the cathode $Q^-$. In this case, the still achievable maximum charge levels of the anode and cathode are determined. The maximum still achievable charge levels are determined on the basis of a discharge state of the battery. This discharge state is determined on the basis of the significant point 3. This may be effected, for example, in that the position of the significant point 3 in the actual open-circuit voltage characteristic 1 is compared with its position in an open-circuit voltage characteristic at the beginning of its life (BOL).

In the case of all embodiments of the method according to the invention, a particularly high accuracy is achieved in estimating the current open-circuit voltage characteristic if an associated point 4 in a characteristic curve of the anode potential 5 of the battery and, in addition, an associated point 4 in a characteristic curve of the cathode potential 6 of the battery are determined, and the characteristic curves are each shifted and/or scaled on the basis of a position of the respectively associated point 4. According to the invention, however, it is sufficient if only one associated point 4 is determined, i.e. either in the characteristic curve of the anode potential 5 or in the characteristic curve of the cathode potential 6 of the battery, and one or both of the characteristic curves is/are shifted on the basis of the position of the significant point 3 in respect of the one associated point 4. This is based on the principle that a necessary scaling and shifting of the characteristic curves is at least similar.

Likewise, a particularly high accuracy is achieved in estimating the current open-circuit voltage characteristic if both scaling and shifting of the characteristic curves are effected. According to the invention, however, it is sufficient if only scaling or only shifting of the characteristic curves is effected. In this way, a necessary computing power for executing the method according to the invention can be reduced considerably.

In addition to the above written disclosure, explicit reference is made to the disclosure of FIGS. 1 to 4.

The invention claimed is:

1. A method for estimating a current open-circuit voltage characteristic of a battery, the method comprising:
    acquiring, with a voltage sensor, a portion of an actual open-circuit voltage characteristic of the battery,
    determining, with a computer, a significant point in the acquired portion of the actual open-circuit voltage characteristic, wherein the significant point is a maximum or a minimum in a slope or curvature of the actual open-circuit voltage characteristic or is a point of inflection of the actual open-circuit voltage characteristic,
    identifying an identified point, with the computer, in a characteristic curve of an anode potential of the battery, in a characteristic curve of a cathode potential of the battery, or both that is associated with the significant point
    shifting and scaling, with the computer, the characteristic curve of the anode potential and the characteristic curve of the cathode potential based on a position of the significant point with respect to the identified point until the acquired portion is simulated by combination of the shifted and scaled characteristic curves,
    calculating, with the computer, the current open-circuit voltage characteristic based on the shifted and scaled characteristic curves, and
    providing, with the computer, a battery capacity on the basis of the current open-circuit voltage characteristic.

2. The method according to claim 1, wherein the acquired portion of the actual open-circuit voltage characteristic is acquired by acquiring an acquired multiplicity of measurement points.

3. The method according to claim 2, wherein determining the significant point includes interpolating the acquired multiplicity of measurement points.

4. The method according to claim 3, wherein that the significant point is a maximum or a minimum in a slope or curvature of the actual open-circuit voltage characteristic, or is a point of inflection of the actual open-circuit voltage characteristic.

5. The method according to claim 4, wherein that the shifting and scaling of one of the two characteristic curves is effected first, and the other of the two characteristic curves is subsequently scaled and shifted to a corresponding extent.

6. The method according to claim 1, wherein the shifting and scaling of one of the two characteristic curves is effected first, and the other of the two characteristic curves is subsequently scaled and shifted to a corresponding extent.

7. A method for estimating a current open-circuit voltage characteristic of a battery, the method comprising:
    acquiring, with a voltage sensor, a portion of an actual open-circuit voltage characteristic of the battery,
    determining, with a computer, a significant point in the acquired portion of the actual open-circuit voltage characteristic, wherein the significant point is a maximum or a minimum in a slope or curvature of the actual open-circuit voltage characteristic or is a point of inflection of the actual open-circuit voltage characteristic,
    identifying an identified point, with the computer, in a characteristic curve of an anode potential of the battery, in a characteristic curve of a cathode potential of the battery, or both that is associated with the significant point,
    shifting and scaling, with the computer, the characteristic curve of the anode potential and the characteristic curve of the cathode potential based on a position of the significant point with respect to the identified point until the acquired portion is simulated by combination of the shifted and scaled characteristic curves, wherein the shifting and scaling of one of the two characteristic curves is effected first, and the other of the two characteristic curves is subsequently scaled and shifted to a corresponding extent,
    calculating, with the computer, the current open-circuit voltage characteristic based on the shifted and scaled characteristic curves; and
    providing, with the computer, a battery capacity on the basis of the current open-circuit voltage characteristic.

* * * * *